United States Patent
Li et al.

(10) Patent No.: US 11,888,017 B2
(45) Date of Patent: Jan. 30, 2024

(54) TRANSPARENT DISPLAY PANEL

(71) Applicant: PlayNitride Display Co., Ltd., MiaoLi County (TW)

(72) Inventors: Yu-Chu Li, MiaoLi County (TW); Kuan-Yung Liao, MiaoLi County (TW); Pei-Hsin Chen, MiaoLi County (TW); Yi-Ching Chen, MiaoLi County (TW); Yi-Chun Shih, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 336 days.

(21) Appl. No.: 17/463,557

(22) Filed: Sep. 1, 2021

(65) Prior Publication Data

US 2021/0399042 A1 Dec. 23, 2021

Related U.S. Application Data

(63) Continuation-in-part of application No. 16/539,483, filed on Aug. 13, 2019, now Pat. No. 11,133,294.

(30) Foreign Application Priority Data

Aug. 15, 2018 (TW) ................................. 107128460

(51) Int. Cl.
| | |
|---|---|
| *H01L 27/15* | (2006.01) |
| *H01L 33/10* | (2010.01) |
| *H01L 33/58* | (2010.01) |

(52) U.S. Cl.
CPC ............ *H01L 27/156* (2013.01); *H01L 33/10* (2013.01); *H01L 33/58* (2013.01)

(58) Field of Classification Search
None
See application file for complete search history.

(56) References Cited

U.S. PATENT DOCUMENTS

| 10,356,858 B2 * | 7/2019 | Wu ...................... H01L 25/0753 |
| 2011/0163683 A1 * | 7/2011 | Steele ...................... F21V 17/14 |
| | | 315/192 |
| 2014/0334137 A1 * | 11/2014 | Hasenoehrl ............... F21K 9/20 |
| | | 362/147 |
| 2016/0240118 A1 * | 8/2016 | Ray ........................ G09G 3/003 |
| 2019/0384445 A1 * | 12/2019 | Huang .................. G06F 3/0443 |

* cited by examiner

*Primary Examiner* — Michelle Mandala
(74) *Attorney, Agent, or Firm* — JCIPRNET

(57) ABSTRACT

A transparent display panel with a light-transmitting substrate, a plurality of top-emitting micro light emitting diodes, a plurality of bottom-emitting micro light emitting diodes, and a light shielding layer. The light transmissive substrate has a surface. These top-emitting micro light emitting diodes and these bottom-emitting micro light emitting diodes are disposed on the surface of the light transmissive substrate. The bottom-emitting micro light emitting diodes has an epitaxial structure and a light shielding member, the epitaxial structure has a pair of upper and lower surfaces on the opposite sides, the lower surface faces toward the light transmissive substrate, and the light shielding member is disposed on the upper surface to shield the light emitted by the bottom-emitting micro light emitting diodes towards the upper surface.

20 Claims, 12 Drawing Sheets

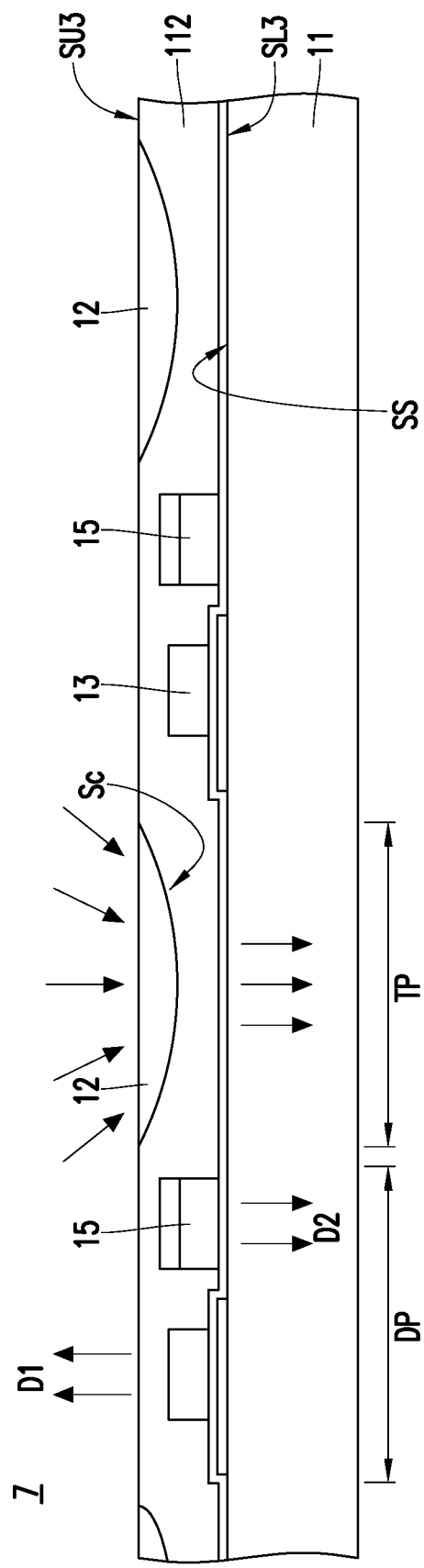

TRANSPARENT DISPLAY PANEL

CROSS-REFERENCE TO RELATED APPLICATION

This application is a continuation-in-part application of and claims the benefit of a prior U.S. application Ser. No. 16/539,483, filed Aug. 13, 2019, now allowed. The prior U.S. application claims the priority benefit of Taiwan application serial no. 107128460 filed in Taiwan, R.O.C. on Aug. 15, 2018. The entirety of each of the above-mentioned patent applications is hereby incorporated by reference herein and made a part of this specification.

BACKGROUND

Technical Field

The present disclosure is related to transparent display panel, and more particularly to a transparent display panel having a plurality of display surfaces.

Description of Related Art

A transparent display panel generally refers to a display panel that a user can see an object behind it from a display surface. Furthermore, some applications of display panels need to provide a double-sided display function, that is, a display panel may have multiple display surfaces, and the user can see the multiple images provided by the display panel from the display surfaces respectively. The display panel with multiple images can be used such as window displays, conferences or signage.

However, as far as the current technology is concerned, the display panel with multiple images is combined two display panels. In the case of a display panel with double-sided display, the thickness and weight of the display module considerably huge, and the light transmittance may be limited, therefore the utility would be reduced.

SUMMARY

The present disclosure will become more fully understood from the detailed description given here in below and the accompanying drawings which are given by way of illustration only and thus are not limitative of the present disclosure and wherein:

The present disclosure is to provide a transparent display panel, which reduces the overall thickness of the transparent display panel while providing multi-image display.

The present disclosure a transparent display panel. The transparent display panel has a light transmissive substrate, a plurality of top-emitting micro light emitting diodes, a plurality of bottom-emitting micro light emitting diodes and a light shielding layer. The light transmissive substrate has a surface. These top-emitting micro light emitting diodes are disposed on the surface of the light transmissive substrate. These bottom-emitting micro light emitting diodes are also disposed on the surface of the light transmissive substrate. Each of the micro light emitting diodes has an epitaxial structure and a light-shielding component, and the epitaxial structure has an upper surface and a lower surface on the opposite side, the lower surface faces toward the light transmissive substrate, and the light-shielding component is disposed on the upper surface to shield the light emitted by the bottom-emitting micro light emitting diodes toward the upper surface. The light shielding layer is disposed on the surface of the light transmissive substrate, and a portion of the light shielding layer is disposed between the top-emitting micro light emitting diode and the light transmissive substrate to shield light emitted from the top-emitting micro light emitting diodes toward the light transmissive substrate.

The above description of the disclosure and the following description of the embodiments of the present disclosure are intended to illustrate and explain the spirit and principles of the invention, and can give a further explain of the present disclosure.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 7 is a partial cross-sectional view showing a transparent display panel according to yet another embodiment of the present disclosure.

FIG. 8 is a partial cross-sectional view showing another embodiment of a transparent display panel according to yet another embodiment of the present disclosure.

DESCRIPTION OF THE EMBODIMENTS

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
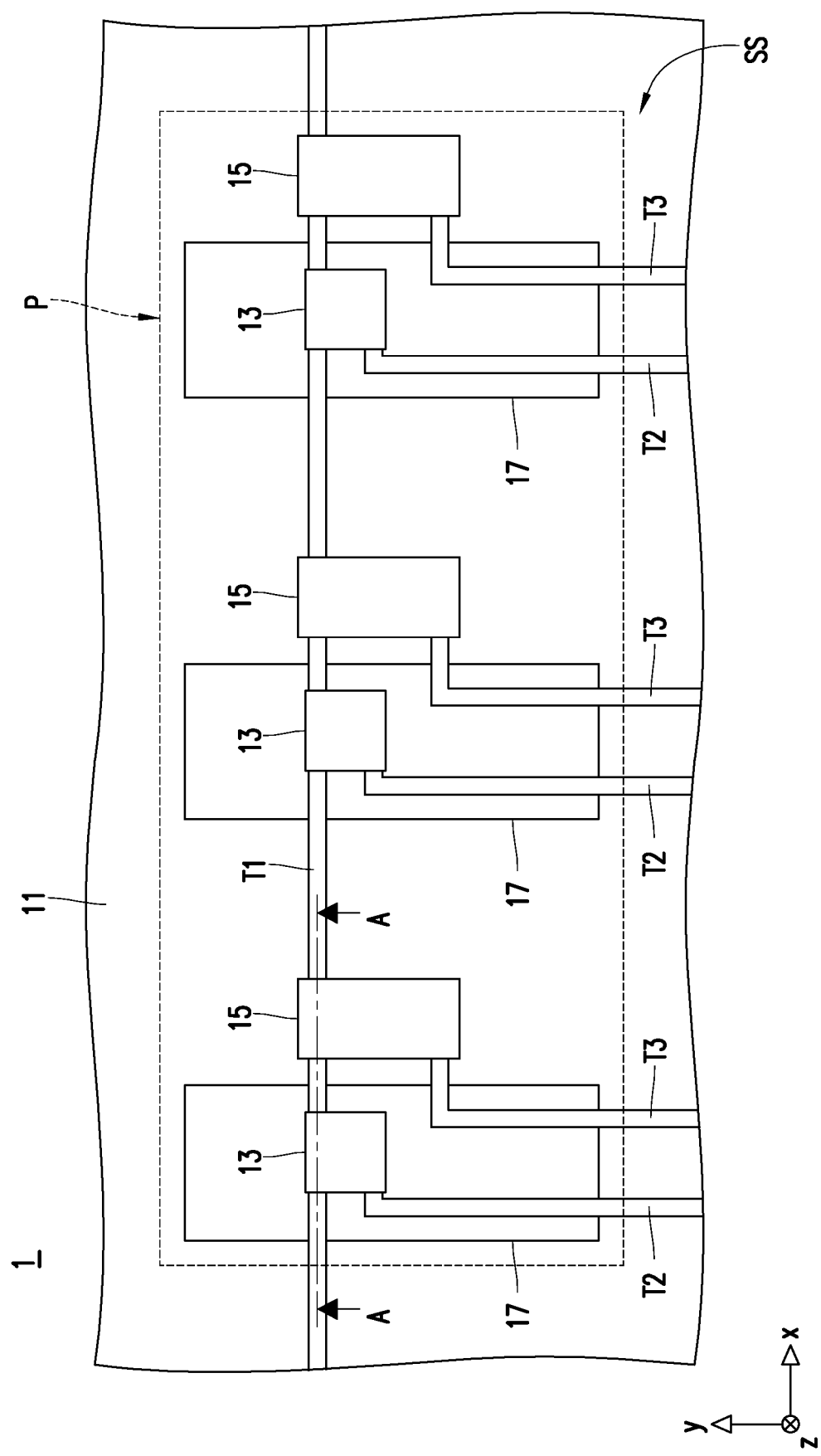
FIG. 1 is a partial top view of a transparent display panel according to an embodiment of the disclosure.

Please refer to FIG. 1. FIG. 1 is a partial top view of a transparent display panel according to an embodiment of the present disclosure. As shown in FIG. 1, the transparent display panel 1 has a light transmissive substrate 11, an top-emitting micro light emitting diode 13, a bottom-emitting micro light emitting diode 15, and a light shielding layer 17. The light transmissive substrate 11 has a surface SS. The top-emitting micro light emitting diode 13, the bottom-emitting micro light emitting diode 15, and the light shielding layer 17 are all disposed on the surface SS. A portion of the light shielding layer 17 is located between the top-emitting micro light emitting diode 13 and the surface SS. In more detail, the surface SS is further provided with control wires T1, T2, T3, the top-emitting micro light emitting diode 13 has two electrodes with different type, such as an N-type electrode and a P-type electrode, and the bottom-emitting micro light emitting diode 15 has two electrodes with different type. In this embodiment, the top-emitting micro light emitting diode 13 and the bottom-emitting micro light emitting diode 15 are electrically connected to the control wires T1, T2, and T3 via the electrodes. That is, by controlling the electric signals transmitted by the control wires T1, T2, and T3, light would be emitted by the top-emitting micro light emitting diode 13 and the bottom-emitting micro light emitting diode 15. In practice, the electrodes of the top-emitting micro light emitting diode 13 and the electrodes of the bottom-emitting micro light emitting diode 15 are electrically connected, for example, via bumps and fixed to the corresponding control wires T1, T2 and T3. In brief description, the electrodes of each micro light emitting diode and the bumps are omitted in FIG. 1. The orthographic projection of the light shielding layer 17 on the surface SS of the light transmissive substrate 11 covers the orthographic projection of the top-emitting micro light emitting diode 13 on the surface SS of the light transmissive substrate 11, and an area of the orthographic projection of the light shielding layer 17 is preferably larger than an area of the orthographic projection of the top-emitting micro light emitting diode 13. Moreover, the area of the orthographic projection of the top-emitting micro light emitting diode 13 disposes entirely in the area of the orthographic projection of the light shielding layer 17. In addition, the orthographic projection of the light shielding layer 17 on the surface SS of the light transmissive substrate 11 and the orthographic projection of the bottom-emitting micro light emitting diode 15 are separated from each other and have a distance between them, that is, the orthographic projection of the light shielding layer 17 and the orthographic projections of the bottom-emitting micro light emitting diodes 15 do not overlap each other. Further, the area of the orthographic projection of the bottom-emitting micro light emitting diode 15 on the surface SS of the light transmissive substrate 11 is larger than the total area of the orthographic projection of the upper light transmissive substrate 13 on the surface SS of the light transmissive substrate 11.

Figure 2:
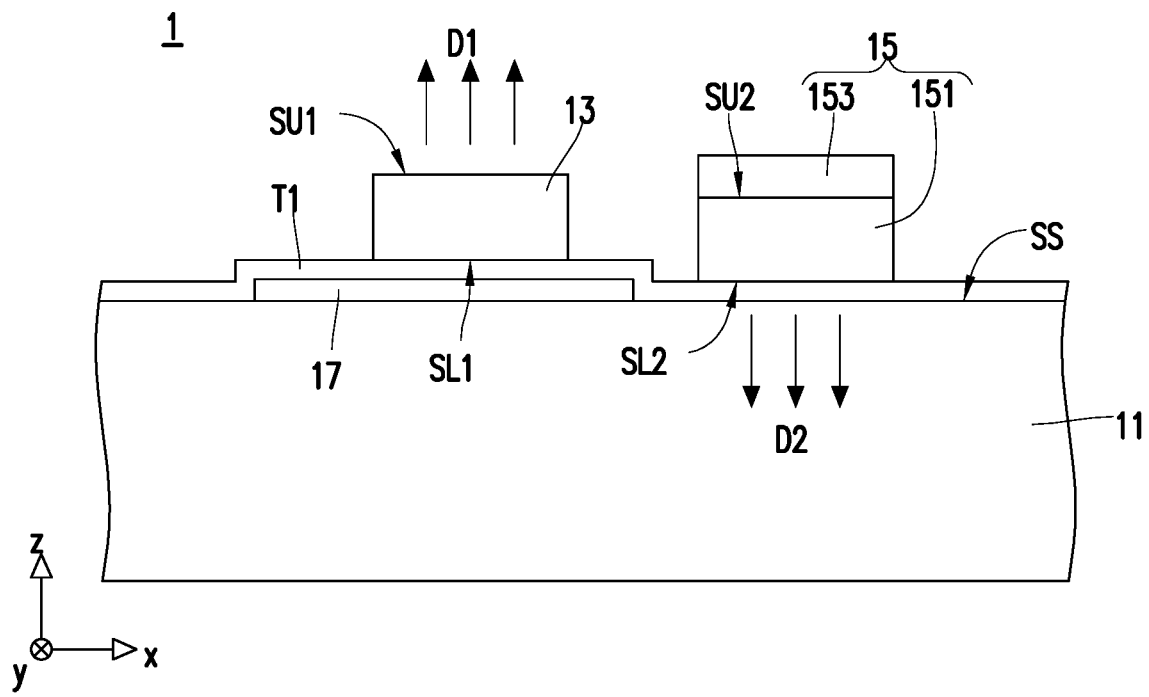
FIG. 2 is a cross-sectional view showing an embodiment of an AA cross section of the transparent display panel illustrated in FIG. 1 according to the present disclosure.

Referring to FIG. 1 and FIG. 2, FIG. 2 is a cross-sectional view showing the AA cross section of the transparent display panel 1 shown in FIG. 1 according to the present disclosure. In this embodiment, the top-emitting micro light emitting diodes 13 are electrically connected and fixed to the control wires T1 and T2 respectively, and the bottom-emitting micro light emitting diodes 15 are electrically connected and fixed to the control traces T1 and T3 respectively. The control wire T1 is, for example, a common electrode conductive layer for providing a reference voltage to the top-emitting micro light emitting diodes 13 and the bottom-emitting micro light emitting diodes 15, and the control wires T2 and T3 are respectively used to provide corresponding control voltage to control the driving current to the top-emitting micro light emitting diode 13 and the bottom-emitting micro light emitting diode 15. The transparent display panel 1 further has a plurality of pixels P. In the embodiment, each of the pixels P is provided with three top-emitting micro light emitting diodes 13 respectively emitting red, blue and green light, and three bottom-emitting micro light emitting diodes 15 respectively emitting red, blue and green light. That is, the top-emitting micro light emitting diodes 13 forms an image in the light-emitting direction D1, and the bottom-emitting micro light emitting diodes 15 forms another image in the light-emitting direction D2, and the resolution of the image in the light-emitting direction D1 is equivalent to the resolution of the image in the light-emitting direction D2. Furthermore, there is a image display surface in the light-emitting direction D1 for the viewer, and the top-emitting micro light emitting diodes 13 are light source for this image display surface, and there is another image display surface in light-emitting direction D2 for the viewer, and the bottom-emitting micro light emitting diodes 15 are light source for this image display surface. The images on the two image display surfaces can be the same or can also be controlled independently.

The top-emitting micro light emitting diode 13 has a upper surface SU1 and lower surface SL1 opposite the upper surface SU1. The lower surface SL1 faces the surface SS, and the light shielding layer 17 is located between the lower surface SL1 and the surface SS. In practice, the light shielding layer 17 may be an non-transparent layer, such as a black photoresist; or the light shielding layer 17 may be a reflective layer, such as a multilayer film (Bragg mirror), an organic coating, a metal, or something alike. The light shielding layer 17 can shield the light emitted from the top-emitting micro light emitting diode 13 in the negative z-axis direction. In the case of the light shielding layer 17 formed by reflective material, the light-shielding layer 17 can reflect the light which emitted from the top-emitting micro light emitting diode 13 towards the negative z-axis direction into toward the positive z-axis direction. Based on the above structure, the main light emitting direction of the top-emitting micro light emitting diodes 13 is the light emitting direction D1 (ie, the positive z-axis direction described above), and the light shielding layer 17 can reduce the light emitted by the top-emitting micro light emitting diodes 13 to the light emitting direction D2, so that it can reduce the interference to the image displayed in the D2 direction.

An epitaxial structure 151 of the bottom-emitting micro light emitting diode 15 has a upper surface SU2 and lower surface SL2 opposite the upper surface SU2. The lower surface SL2 faces the surface SS. The bottom-emitting micro light emitting diode 15 further has a light shielding component 153 disposed on the upper surface SU2. Similar to the light shielding layer 17, the light shielding component 153 may be an nontransparent layer, such as a blackened metal or a resin material; or the light blocking member 153 may be a reflective layer, such as a multilayer film (Bragg mirror), an organic coating, a metal, etc. The light shielding component 153 can shield or reflect the light emitted by the bottom-emitting micro light emitting diode 15 in the positive z-axis direction. Furthermore, the light emitted by the bottom-emitting micro light emitting diode 15 emits to the negative z-axis direction mostly. Therefore, the light shielding component 153 can shield the light emitted by the bottom-emitting micro light emitting diode 15 toward the light-emitting direction D1, so that it can reduce the interference to the image displayed in the D1 direction.

The top-emitting micro light emitting diodes 13 and the bottom-emitting micro light emitting diodes 15 emit light in the positive z-axis direction (light-emitting direction D1) and the negative z-axis direction (light-emitting direction D2), respectively. The transparent display panel 1 can provide the same or different images in the positive z-axis direction and the negative z-axis direction at the same time. Therefore, according to the corresponding control manner, the user can see the same or different images from the two sides of the transparent display panel 1, respectively.

It should be noted that, in the embodiment shown in FIG. 1, the bottom-emitting micro light emitting diode 15 is larger than the top-emitting micro light emitting diode 13 such that the light-emitting surface of the bottom-emitting micro light emitting diode 15 is larger than the light-emitting surface of the top-emitting micro light emitting diode 13. Since the light provided by the bottom-emitting micro light emitting diode 15 needs to pass through the light-shielding region of the light transmissive substrate 11 and the wiring layer, the light intensity thereof is affected. Thus, the area of the light-emitting surface is adjusted by adjusting the size of the bottom-emitting micro light emitting diode 15 to improve the light intensity to display the image in the light-emitting direction D2. Although this example is carried out in this way, but in general, the bottom-emitting micro light emitting diode 15 is not necessarily larger than the top-emitting micro light emitting diode 13.

Figure 3:
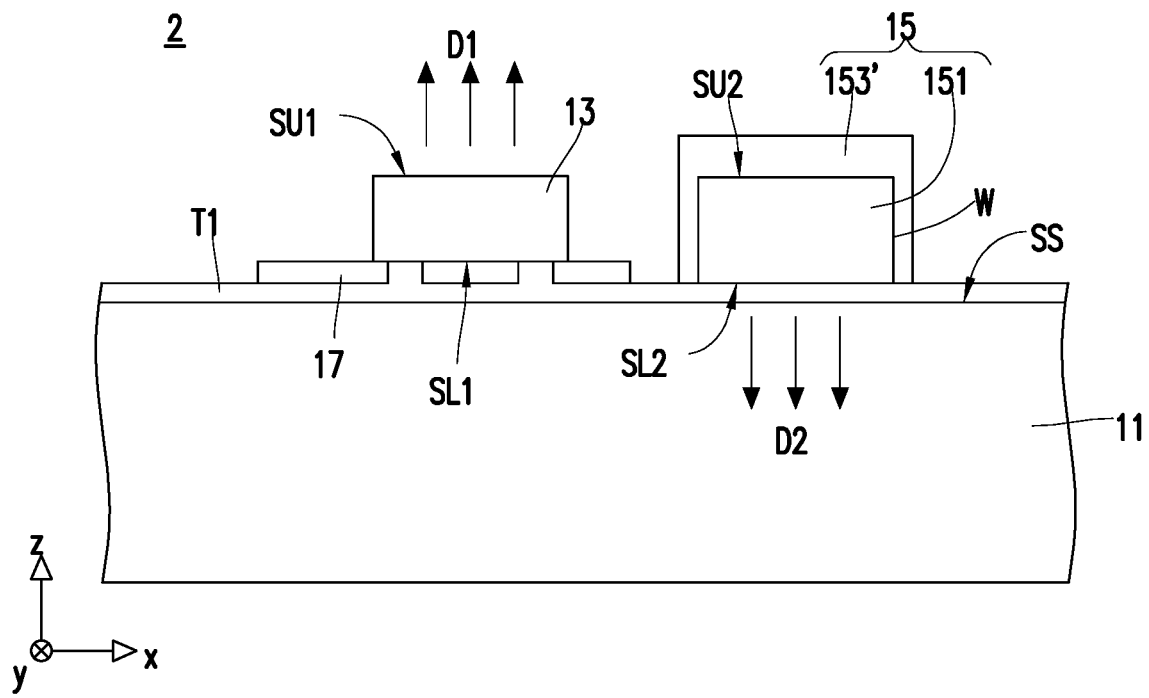
FIG. 3 is a cross-sectional view showing another embodiment of the transparent display panel illustrated in FIG. 1 according to the present disclosure.

Please refer to FIG. 3. FIG. 3 is a cross-sectional view of the transparent display panel 2 according to another embodiment of the present disclosure. With compared to FIG. 2, control wires (including T1, T2, T3, and in this section only shows T1) is formed on the surface SS of the light transmissive substrate 11 in FIG. 3, and the light shielding layer 17 is formed on the control wires. In other words, the light shielding layer 17 is disposed between the control wire T1 and the top-emitting micro light emitting diode 13. Further, the epitaxial structure 151 of the bottom-emitting micro light emitting diode 15 has a side wall W. Two ends of the side wall W are in contact with the upper surface SU2 and the lower surface SL2, respectively. The light shielding component 153' of the bottom-emitting micro light emitting diode 15 covers at least a portion of the side wall W. Thereby, the light emitted from the bottom-emitting micro light emitting diode 15 in the light-emitting direction D1 is blocked, and the display quality is improved.

Figure 4A:
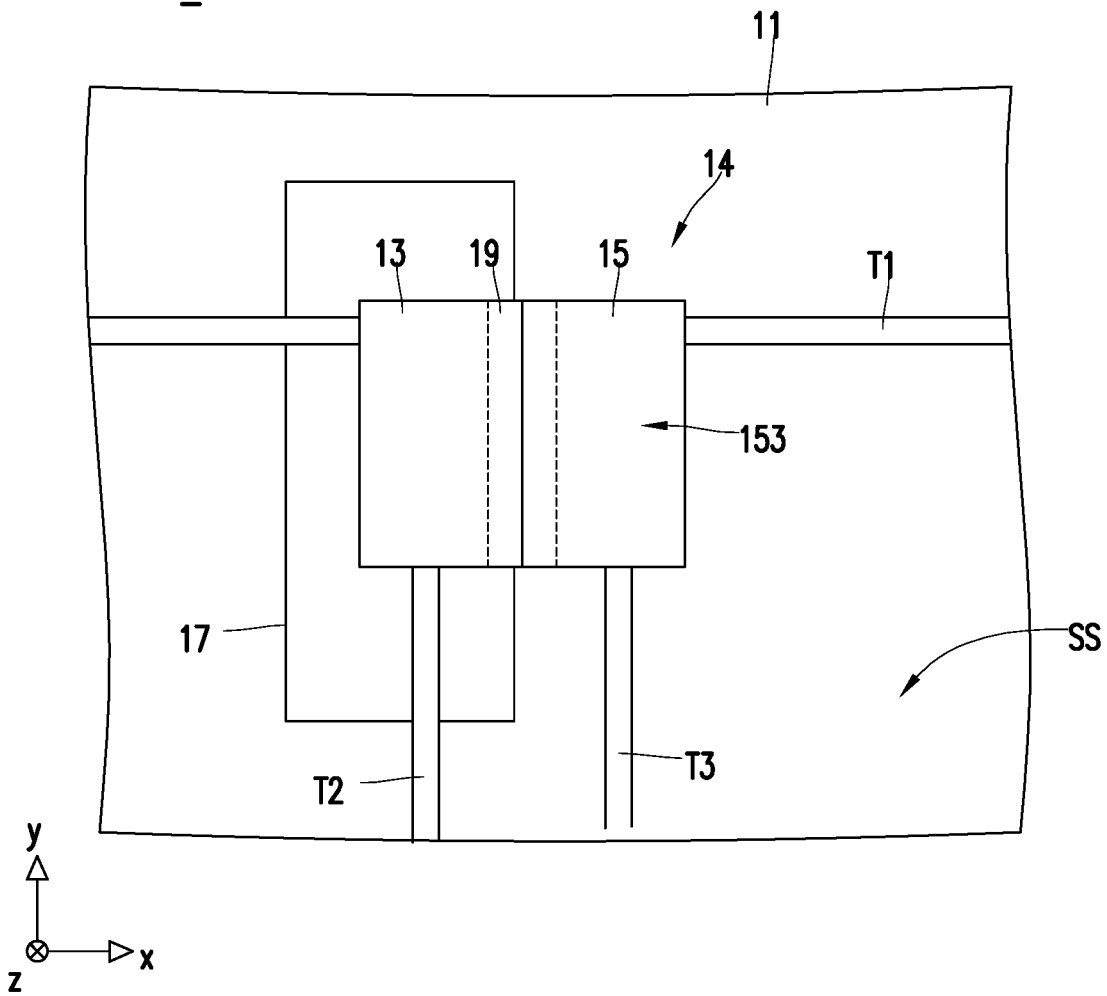
FIG. 4A is a partial top view of a transparent display panel according to an embodiment of the disclosure.
Figure 4B:
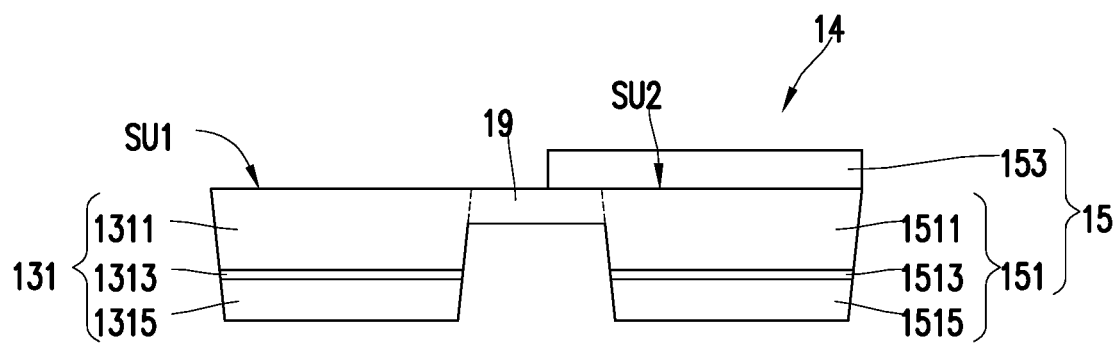
FIG. 4B is a cross-sectional view of a micro light emitting diode crystal of the transparent display panel illustrated in FIG. 4A according to the present disclosure.

Please refer to FIG. 4A and FIG. 4B, FIG. 4A is a partial top view of a transparent display panel 4 according to an embodiment of this disclosure, and FIG. 4B is a schematic view of the micro light emitting diode chip 14 of FIG. 4A according to the present disclosure. In this embodiment, one of the top-emitting micro light emitting diode 13 connects to one of the bottom-emitting micro light emitting diode 15 to form the micro light emitting diode chip 14. As shown in FIG. 4B, the epitaxial structure 151 of the bottom-emitting micro light emitting diode 15 has a I-type semiconductor layer 1511, a light-emitting layer 1513 and a II-type semiconductor layer 1515, and the light-emitting layer 1513 is located between the I-type semiconductor layer 1511 and the II-type semiconductor layer 1515. The epitaxial structure 131 of the top-emitting micro light emitting diode 13 has a I-type semiconductor layer 1311, a light-emitting layer 1313 and a II-type semiconductor layer 1315, and the light-emitting layer 1313 is located between the I-type semiconductor layer 1311 and the II-type semiconductor layer 1315. The I-type semiconductor layer 1511 of the bottom-emitting micro light emitting diode 15 is connected to the I-type semiconductor layer 1311 of the top-emitting micro light emitting diode 13 with a connection portion 19.

In practice, the material of the I-type semiconductor layer 1311 and 1511 is the same. In one embodiment, an epitaxial layer concludes the I-type semiconductor layer 1311, the connection portion 19 and the I-type semiconductor layer 1511. The light shielding component 153 is formed on I-type semiconductor layer 1511 and covers the light-emitting layer 1513, but does not cover the I-type semiconductor layer 1311 and the light-emitting layer 1313.

The I-type semiconductor layer 1311, the connection portion 19 and the I-type semiconductor layer 1511 are a N-type semiconductor, and the II-type semiconductor layer 1315 and 1515 are P-type semiconductor. In the transparent display panel 4 of the present embodiment, the top-emitting micro light emitting diode 13 and the bottom-emitting micro light emitting diode 15 are combined to form one micro light emitting diode chip 14, so that the number of the micro light emitting diode chips being transferred can be reduced by half, and the transfer process can be reduced, thereby improving the process yield.

Figure 5:
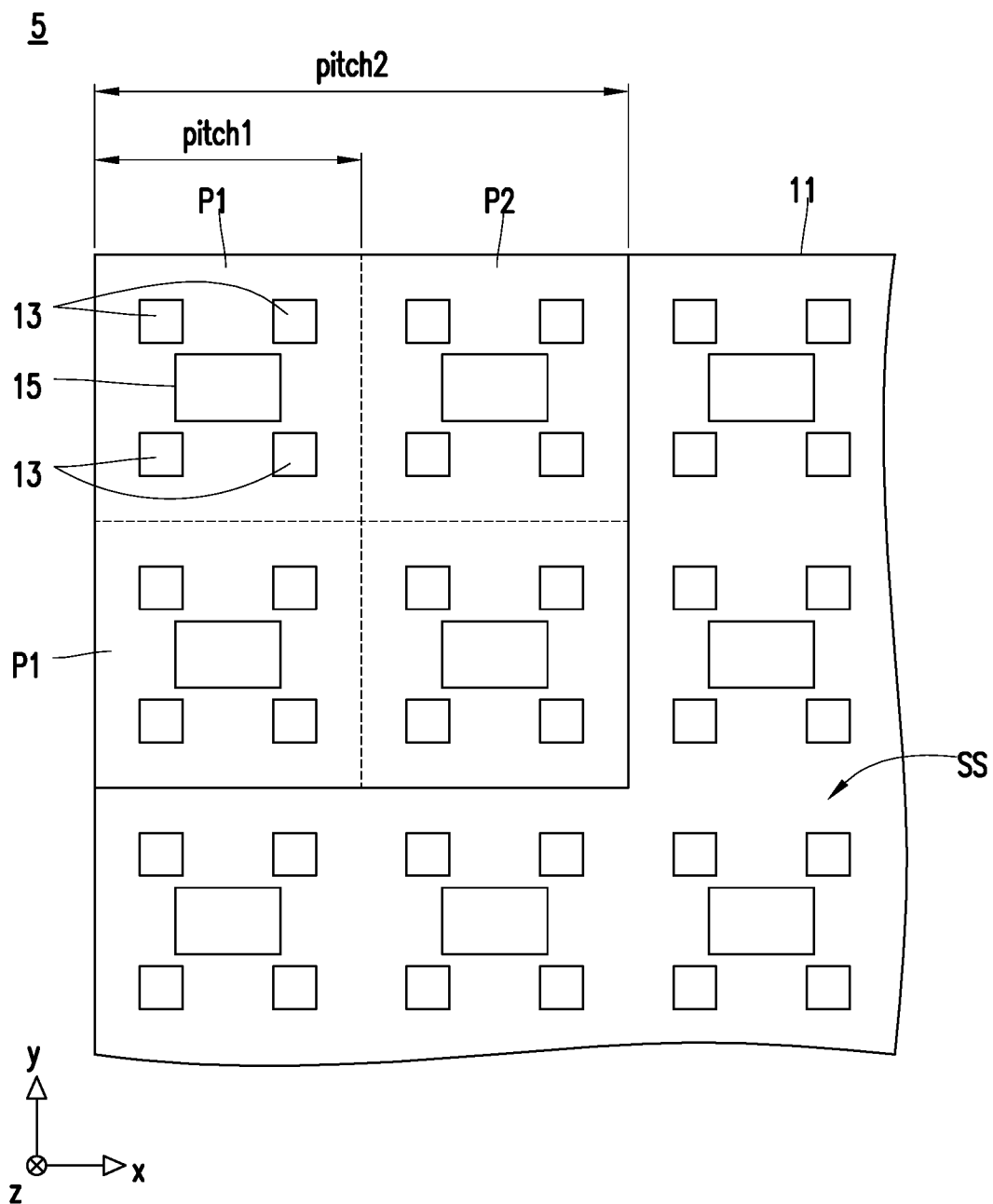
FIG. 5 is a partial top view of a transparent display panel according to an embodiment of the disclosure.

Please refer to FIG. 5. FIG. 5 is a partial top view of a transparent display panel 5 according to an embodiment of this disclosure. The transparent display panel 5 has a plurality of first pixels P1 and a plurality of second pixels P2. The top-emitting micro light emitting diode 13 is disposed on the first pixel P1, and the bottom-emitting micro light emitting diode 15 is disposed on the second pixel P2. Each of the first pixels P1 includes a plurality of top-emitting micro light emitting diodes 13 respectively used to provide light of different colors. Similarly, each second pixel P2 includes a plurality of bottom-emitting micro light emitting diodes 15 as described above and respectively used to provide light of different colors. In other words, the first pixels constitute an image displayed in the positive z-axis direction, and the second pixels constitute another image displayed in the negative z-axis direction, and the pitch of the first pixels P1 is different from the pitch of the second pixels P2. The resolution of the image displayed in the positive z-axis direction is different from the resolution of the image displayed in the negative z-axis direction.

In this embodiment, one of the first pixels P1 has four top-emitting micro light emitting diodes 13 with an arrangement of RGBY or RGBW; one of the second pixels P2 has four bottom-emitting micro light emitting diodes 15 with an arrangement of RGBY or RGBW. In addition, a second pixel P2 corresponds to four first pixels P1, that is, the resolution of the image displayed by the bottom-emitting micro light emitting diodes 15 is only a quarter of the resolution of the image displayed by the top-emitting micro light emitting diodes 13. In other words, the number of bottom-emitting micro light emitting diodes 15 is less than the number of top-emitting micro light emitting diodes 13. By reducing the number of the second pixels in one of the dispalY-axis directions, the light transmittance can be increased, and process cost can down. On the other hand, the micro light emitting diodes in each pixel are arranged in RGBY or RGBW, the light provided by each pixel may have greater brightness or better color rendering. In practice, the first pixels P1 or the second pixels P2 may also adopt an RGB configuration, which is not limited herein. A first image is shown by the first pixels P1 on one side of the light transmissive substrate 11, and a second image is shown by the second pixels P2 on another side of the light transmissive substrate 11.

Figure 6:
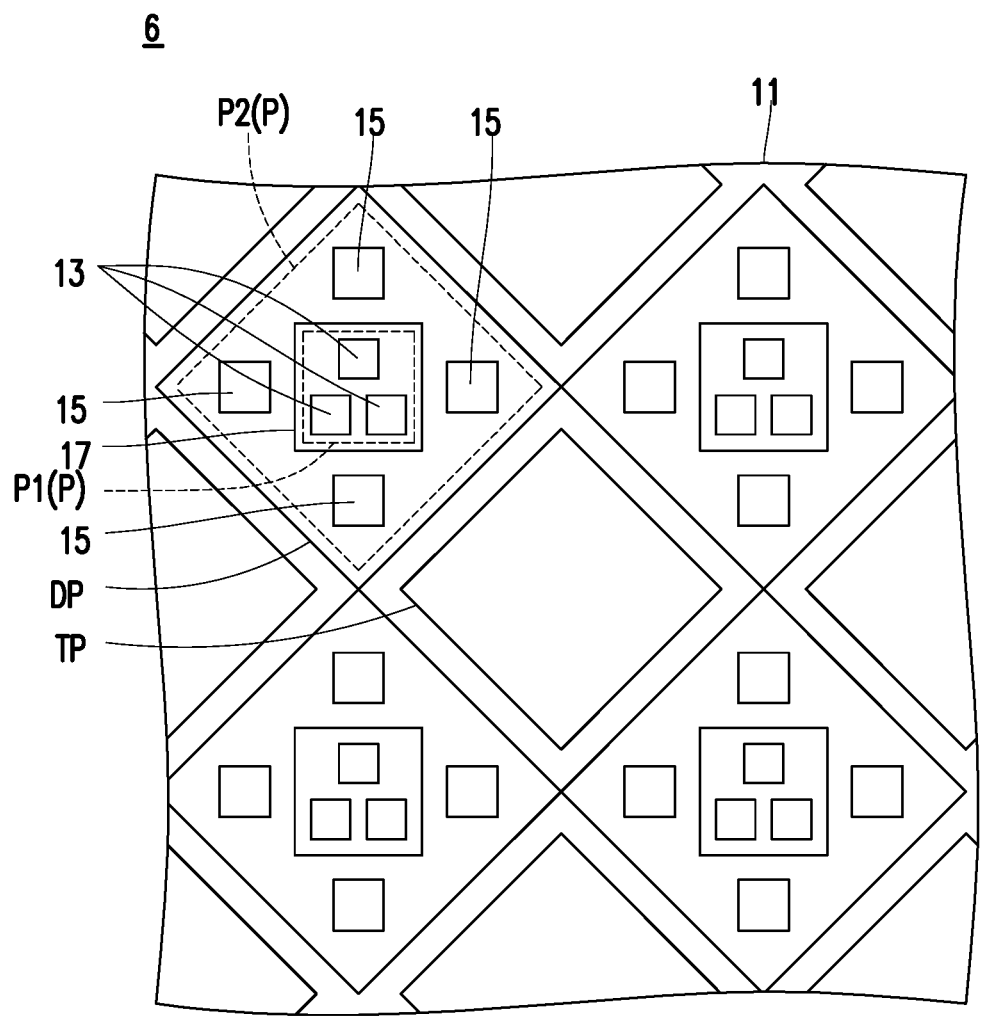
FIG. 6 is a partial top view of a transparent display panel according to another embodiment of the disclosure.

Referring to FIG. 6 again, FIG. 6 is a partial top view of the transparent display panel 6 according to another embodiment of this disclosure. In this embodiment, the transparent display panel 6 is similar to the transparent display panel 1, and the differences are as follows. The transparent display panel 6 further includes a plurality of light transmission areas TP and a plurality of component setting areas DP. The top-emitting micro light emitting diodes 13, the bottom-emitting micro light emitting diodes 15 and most of the control wires (not shown) are disposed in the component setting areas DP, and the light transmission areas TP allows the light to pass through the light transmissive substrate 11. The transparent display panel 6 includes a plurality of pixels P disposed in component setting areas DP respectively. Each pixel P includes a first pixel P1 composed of three top-emitting micro light emitting diodes 13 and a second pixel P2 composed of four bottom-emitting micro light emitting diodes 15. The light shielding layer 17 is disposed between the top-emitting micro light emitting diodes 13 and the light transmissive substrate 11 in every first pixel P1 to shield the light emitted from the top-emitting micro light emitting diodes 13 in the direction towards the light transmissive substrate 11. The second pixel P2 may adopt an arrangement of RGBW or RGBY, so that the light provided by the second pixel P2 can improve brightness or color recognition after passing through the light transmissive substrate 11. In other embodiment, the micro light emitting diodes 13 in each first pixel P1 can be arranged in RGB, RGBW, RGBY or other feasible pixel arrangement, and is not necessarily the same as the arrangement of the second pixel, and is not limited therein. In one embodiment, one of the first pixels P1 overlaps one of the second pixels P2.

Referring to FIG. 7, FIG. 7 is a partial cross-sectional view of a transparent display panel 7 according to a further embodiment of the present disclosure. The transparent display panel 7 is similar to the transparent display panel 6 shown in FIG. 6. The main differences are as follows: The transparent display panel 7 further has a plurality of lens components 12 and a transparent insulation layer 112. The transparent insulation layer 112 is disposed on the surface SS of the light transmissive substrate 11, and the lens components 12 are disposed on the transparent insulation layer 112 and on the transparent regions TP. A light-concentrating surface Sc of the lens component 12 faces toward the surface SS of the light transmissive substrate 11. By the arrangement of the lens components 12, more light can be collected to pass through the light transmissive substrate 11 to increase the light transmittance of the transparent display panel 7.

Please refer to FIG. 8. FIG. 8 is a partial cross-sectional view showing a transparent display panel 8 according to a further embodiment of the present disclosure. The structure of the transparent display panel 8 is similar to that of the transparent display panel 7. The difference is that the transparent display panel 8 has a cover substrates 16 disposed on the transmissive substrate 11. The cover substrate 16 has an upper surface SU4 and a lower surface SL4 opposite to the upper surface SU4, and the lower surface SL4 faces toward the light transmissive substrate 11. The lens components 12 are disposed on the lower surface SL4 of the cover substrate 16, and the light-concentrating surfaces Sc of the lens components 12 face the surface SS of the light transmissive substrate 11. The cover substrate 16 is also made of a light-transmitting material, and can be selected from the same material as the light transmissive substrate 11.

In other embodiments, the lens component 12 can be a concave lens structure, a convex lens structure, or even a combination of different lenses, wherein the light is concentrated to increase light transmittance.

Figure 9:
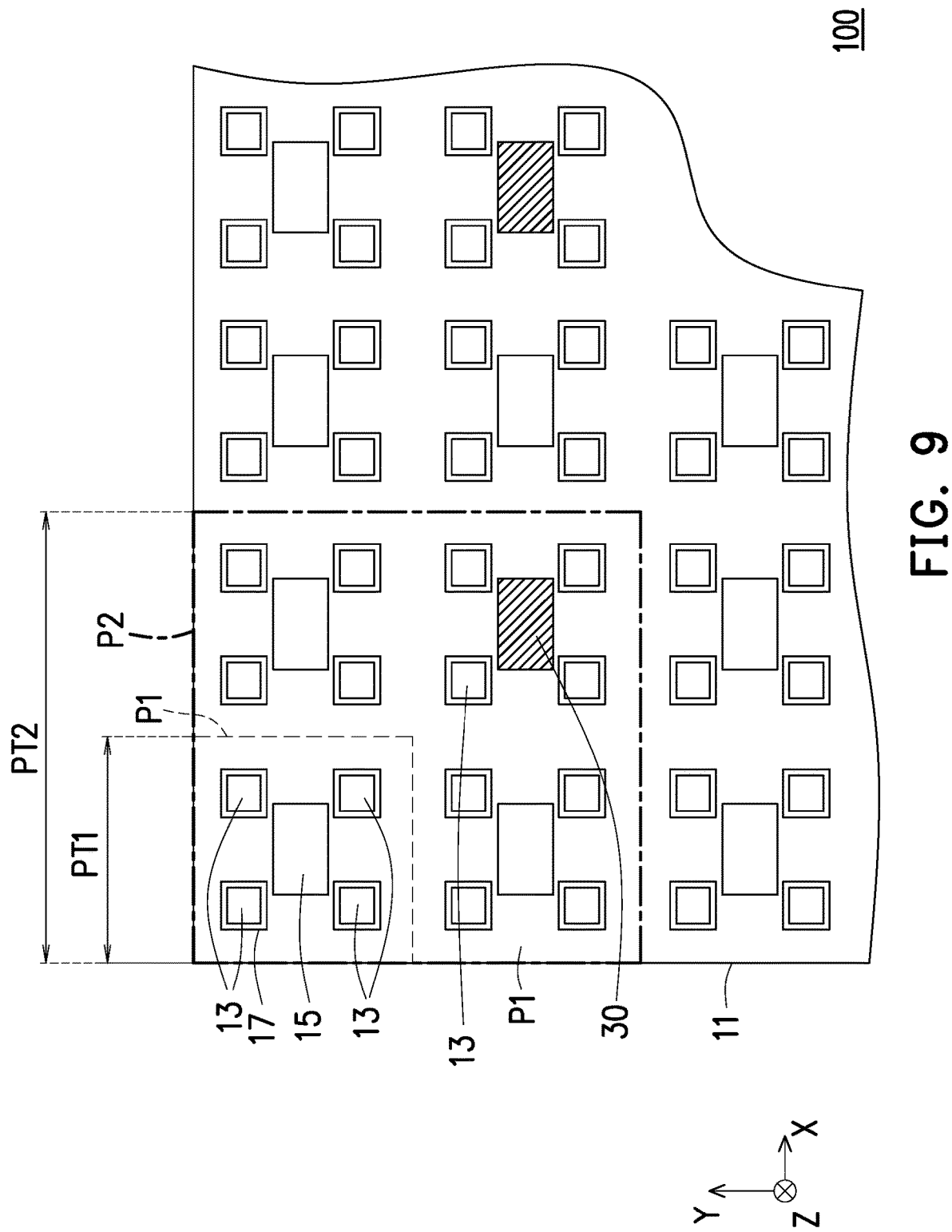
FIG. 9 is a partial top view of a transparent display panel 100 according to an embodiment of this disclosure.

Please refer to FIG. 9. FIG. 9 is a partial top view of a transparent display panel 100 according to an embodiment of this disclosure. The transparent display panel 100 shown in FIG. 9 includes a light transmissive substrate 11, a plurality of top-emitting micro light emitting diodes 13, a plurality of bottom-emitting micro light emitting diodes 15, and a plurality of pixel-solar cells 30. The light transmissive substrate 11, the top-emitting micro light emitting diodes 13, and the bottom-emitting micro light emitting diode 15 are similar to those corresponding components described in FIG. 5 and thus the descriptions for these components in FIG. 5 are applicable to the transparent display panel 100. In addition, similar to the transparent display panel 5, the transparent display panel 100 further includes a light shielding layer 17 that is disposed corresponding to the top-emitting micro light emitting diodes 13 for shielding the rays emitted from the top-emitting micro light emitting diodes 13 towards the light transmissive substrate 11. In the embodiment, the top-emitting micro light emitting diodes 13, the bottom-emitting micro light emitting diode 15, and a plurality of pixel-solar cells 30 are dispose on the same surface (e.g. the top surface shown in FIG. 9) of the light transmissive substrate 11 and the light shielding layer 17 is disposed between the top-emitting micro light emitting diodes 13 and the light transmissive substrate 11. For illustration purpose, the rectangles with hatch lines in FIG. 9 represent the pixel-solar cells 30 while the same shaped blank rectangles represent the bottom-emitting micro light emitting diode 15.

In the embodiment, the transparent display panel 100 has a plurality of first pixels P1 and a plurality of second pixels P2. The first pixels P1 are arranged on the surface (e.g. the top surface shown in FIG. 9) of the light transmissive substrate 11 to form an image in a first direction (e.g. the positive Z-axis direction). The second pixels P2 are arranged on the same surface of the light transmissive substrate 11 as the first pixels P1 to form an image in a second direction (e.g. the negative Z-axis direction). The first pixels P1 and the second pixels P1 can be considered as display units for forming images in the first direction and the second direction, respectively. A pitch PT1 of the first pixels P1 is different from a pitch PT2 of the second pixels P2. For example, the pitch PT1 of the first pixels P1 is smaller than a pitch PT2 of the second pixels P2 and the resolution of the image in a first direction is higher than that in a second direction. Accordingly, the image displayed by the transparent display panel 100 in the first direction can have a resolution different from the image displayed by the transparent display panel 100 in the second direction, but the disclosure is not limited thereto.

The top-emitting micro light emitting diodes 13 are used for emitting rays in the first direction and are arranged in the first pixels P1. As shown in FIG. 9, in one first pixel P1, four top-emitting micro light emitting diodes 13 are arranged in a 2×2 array and the four top-emitting micro light emitting diodes 13 in the same first pixel P1 can emit rays of different colors. For example, the top-emitting micro light emitting diodes 13 in one single first pixel P1 can respectively emit rays of RGBW (red-green-blue-white) colors or RGBY (red-green-blue-yellow) colors, but the disclosure is not limited thereto. In some embodiments, the top-emitting micro light emitting diodes 13 disposed on the light transmissive substrate 11 can have an identical pitch in X-axis direction, or Y-axis direction. As such, the pitch of top-emitting micro light emitting diodes 13 can be a half of the pitch PT1 of the first pixels P1, but the disclosure is not limited thereto.

In the embodiment, from the top view, a size of each of the bottom-emitting micro light emitting diodes 15 is larger than a size of each of the top-emitting micro light emitting diodes 13. In some embodiments, a size of each of the pixel-solar cell 30 is also larger than a size of each of the top-emitting micro light emitting diodes 13. The bottom-emitting micro light emitting diodes 15 and the pixel-solar cells 30 are arranged in the second pixels P2. For example, three bottom-emitting micro light emitting diodes 15 and one pixel-solar cell 30 are arranged in a 2×2 array in one single second pixels P2, but the disclosure is not limited thereto. In the embodiment, four top-emitting micro light emitting diodes 13 in one first pixel P1 surround one top-emitting micro light emitting diode 15 and four top-emitting micro light emitting diodes 13 in another first pixel P1 surround one pixel-solar cell 30, but the disclosure is not limited thereto.

In some embodiments, the three bottom-emitting micro light emitting diodes 15 in one single second pixel P2 can respectively emit rays of RGB (red-green-blue) colors, but the disclosure is not limited thereto. In some embodiments, the bottom-emitting micro light emitting diodes 15 and the pixel-solar cells 30 can be arranged in an identical pitch in X-axis direction, or Y-axis direction so that a pitch of adjacent two of the bottom-emitting micro light emitting diodes 15 and the pixel-solar cells 30 can be a half of the pitch PT2 of the second pixels P2, but the disclosure is not limited thereto. In some embodiments, the pixel-solar cells 30 may be absent in some of the second pixels P2 so that only bottom-emitting micro light emitting diodes 15 are arranged in such second pixels P2.

In the embodiment, the pixel-solar cells 30 arranged in the second pixels P2 can have a pillar structure or a thin film structure and includes the material capable of converting photonic energy into electricity. Furthermore, the pixel-solar cells 30 are bonded to the light transmissive substrate 11 by a mass-transfer process. For example, the material capable of converting photonic energy into electricity includes single crystalline silicon, poly crystalline silicon, amorphous silicon, SiC, SiGe, SiH, SiO, GaAs, InP, CdS, CdTe, CuInSe, CIGS, TiO2, or the like. The electricity generated by the pixel-solar cells 30 can be utilized by the transparent display panel 100, so that the required external power of the transparent display panel 100 is reduced.

Figure 10:
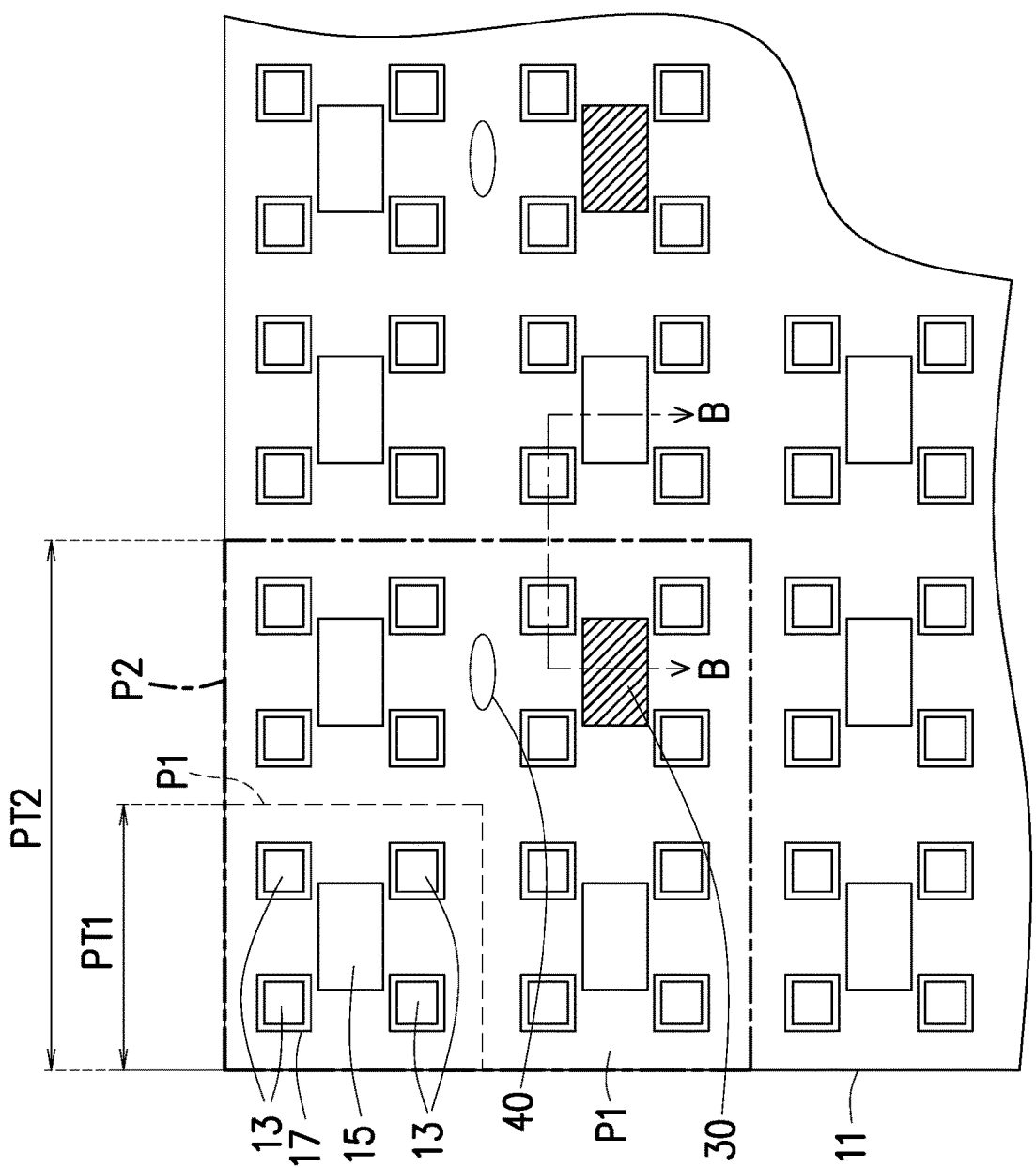
FIG. 10 is a partial top view of a transparent display panel 200 according to an embodiment of this disclosure.

Please refer to FIG. 10. FIG. 10 is a partial top view of a transparent display panel 200 according to an embodiment of this disclosure. The transparent display panel 200 is similar to the transparent display panel 100 and includes all components of the transparent display panel 100. Specifically, the transparent display panel 200 is different from the transparent display panel 100 in that the transparent display panel 200 further includes a light guide element 40 disposed on the surface of the light transmissive substrate 11. In some embodiments, the light guide element 40 can be positioned at suitable location so that the light guide element 40 is able to reflect or refract ambient light toward the pixel-solar cells 30. For example, the light guide element 40 can be arranged around and/or adjacent the pixel-solar cells 30. In some embodiments, the material of the light guide element 40 can include a reflective material. In some embodiments, the light guide element 40 can be a structure capable of reflect or refract light. In some embodiments, the light guide element 40 can be a Bragg reflector. The size, the shape, the quantity, and the material of the light guide element 40 can be adjusted based on different requirement. In some embodiments, the transparent display panel 200 with the light guide elements 40 still has an overall light transmittance greater the 40% so as to ensure the transparent effect.

Figure 11A:
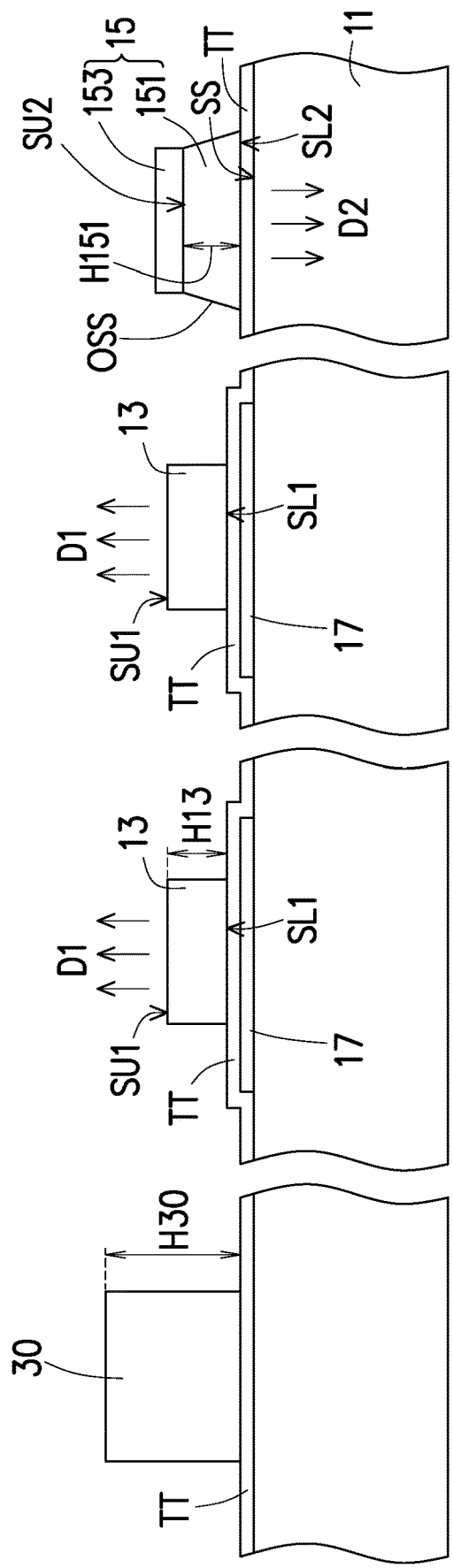
FIG. 11A is a cross-sectional view showing an embodiment of a BB cross section of the transparent display panel illustrated in FIG. 10 according to the present disclosure.

FIG. 11A is a cross-sectional view showing an embodiment of a BB cross section of the transparent display panel 200 illustrated in FIG. 10 according to the present disclosure. The cross section shown in FIG. 11A is also applicable to the transparent display panel 100 in FIG. 9. Please refer to FIG. 10 and FIG. 11A. The light transmissive substrate 11 has a surface SS, and the top-emitting micro light emitting diodes 13, the bottom-emitting micro light emitting diodes 15, and the light shielding layer 17 and the pixel-solar cells 30 are all disposed on the surface SS. A portion of the light shielding layer 17 is located between the top-emitting micro light emitting diode 13 and the surface SS. The surface SS is further provided with control-wires layer TT for transmitting the required electric signals of the top-emitting micro light emitting diodes 13, the bottom-emitting micro light emitting diodes 15, and the pixel-solar cells 30. The control-wires layer TT includes a lot of conductive wires to form a plurality of circuits for controlling the top-emitting micro light emitting diodes 13, the bottom-emitting micro light emitting diodes 15, and the pixel-solar cells 30 respectively. The disposition relationships of the top-emitting micro light emitting diodes 13, the bottom-emitting micro light emitting diodes 15, and the light shielding layer 17 can refer to the description of FIG. 9 and not reiterate here.

In the embodiment, the top-emitting micro light emitting diode 13 has a upper surface SU1 and lower surface SL1 opposite the upper surface SU1 and the light shielding layer 17 is disposed between the top-emitting micro light emitting diodes 13 and the light transmissive substrate 11 so that the rays emitted from the top-emitting micro light emitting diodes 13 towards the lower surface SL1 are shielded to ensure the rays from top-emitting micro light emitting diodes 13 not passing through the light transmissive substrate 11 in the light emitting direction D2 (the negative Z-axis direction). In other words, the top-emitting micro light emitting diodes 13 form an image in the light-emitting direction D1 (the positive Z-axis direction). The light shielding layer 17 may be an non-transparent layer, such as a black photoresist; or the light shielding layer 17 may be a reflective layer, such as a multilayer film (Bragg mirror), an organic coating, a metal, or something alike.

The bottom-emitting micro light emitting diode 15 includes an epitaxial structure 151 and a light shielding component 153. The epitaxial structure 151 of the bottom-emitting micro light emitting diode 15 has an upper surface SU2 and a lower surface SL2 opposite the upper surface SU2. In some embodiments, the epitaxial structure 151 can have an oblique and reflective side surface OSS, but the disclosure is not limited thereto. The bottom-emitting micro light emitting diode 15 is so oriented that the lower surface SL2 faces the surface SS. The light shielding component 153 is disposed on the upper surface SU2. Similar to the light shielding layer 17, the light shielding component 153 may be a nontransparent layer, such as a blackened metal or a resin material; or the light blocking member 153 may be a reflective layer, such as a multilayer film (Bragg mirror), an organic coating, a metal, etc. The light shielding component 153 can shield and/or reflect the rays emitted by the bottom-emitting micro light emitting diode 15 in the light emitting direction D2. Accordingly, the bottom-emitting micro light emitting diodes 15 form another image in the light-emitting direction D2. The transparent display panel 200 can display different images in the light emitting direction D1 and the light emitting direction D2 since the image in the light emitting direction D1 and the image in the light emitting direction D2 are independently formed by the rays emitted from the top-emitting micro light emitting diodes 13 and the rays emitted from the bottom-emitting micro light emitting diodes 15.

The pixel-solar cell 30 has a pillar structure as shown in FIG. 11A. In some embodiments, a height H30 of the pillar structure can be greater than a height H13 of the epitaxial structure of the top-emitting micro light emitting diode 13 and also greater than a height H151 of the epitaxial structure 151 of the bottom-emitting micro light emitting diode 15. The greater height of the pixel-solar cell 30 helps to increase the light receiving surface and improve the photoelectric conversion ability. In some embodiments, the pixel-solar cell 30 can have a thin-film structure with a thickness less than 1 μm, but the disclosure is not limited thereto. The structure of the pixel-solar cell 30 can be adjusted based on various requirements.

Figure 11B:
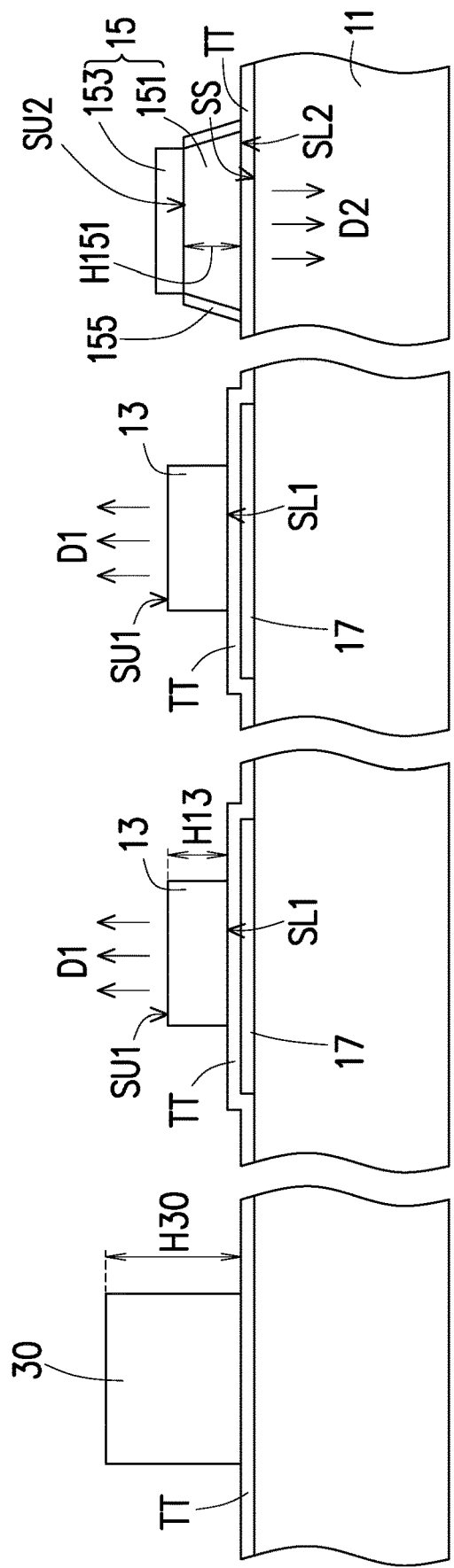
FIG. 11B is a cross-sectional view showing an embodiment of a BB cross section of the transparent display panel 200 illustrated in FIG. 10 according to the present disclosure.

FIG. 11B is a cross-sectional view showing an embodiment of a BB cross section of the transparent display panel 200 illustrated in FIG. 10 according to the present disclosure. The structure shown in FIG. 11B is similar to that shown in FIG. 11A and the same reference numbers in the two embodiments represent the same components. In the embodiment, the bottom-emitting micro light emitting diode 15 further includes a reflective sidewall 155. The reflective sidewall 155 can reflect light toward the adjacent pixel-solar cell 30 so as to improve the photoelectric conversion efficiency of the pixel solar cell 30. The reflective sidewall 155 can reflect the rays emitted by the bottom-emitting micro light emitting diode 15 to the lower surface SL2 to improve the light extraction efficiency. In some embodiments, the reflective sidewall 155 is oblique with respect to the surface SS of the light transmissive substrate 11. For example, the reflective sidewall 155 forms an angle with respect to the surface SS. In some embodiments, the angle formed by the reflective sidewall 155 and the surface SS is not a right angle, but the disclosure is not limited thereto.

Figure 12:
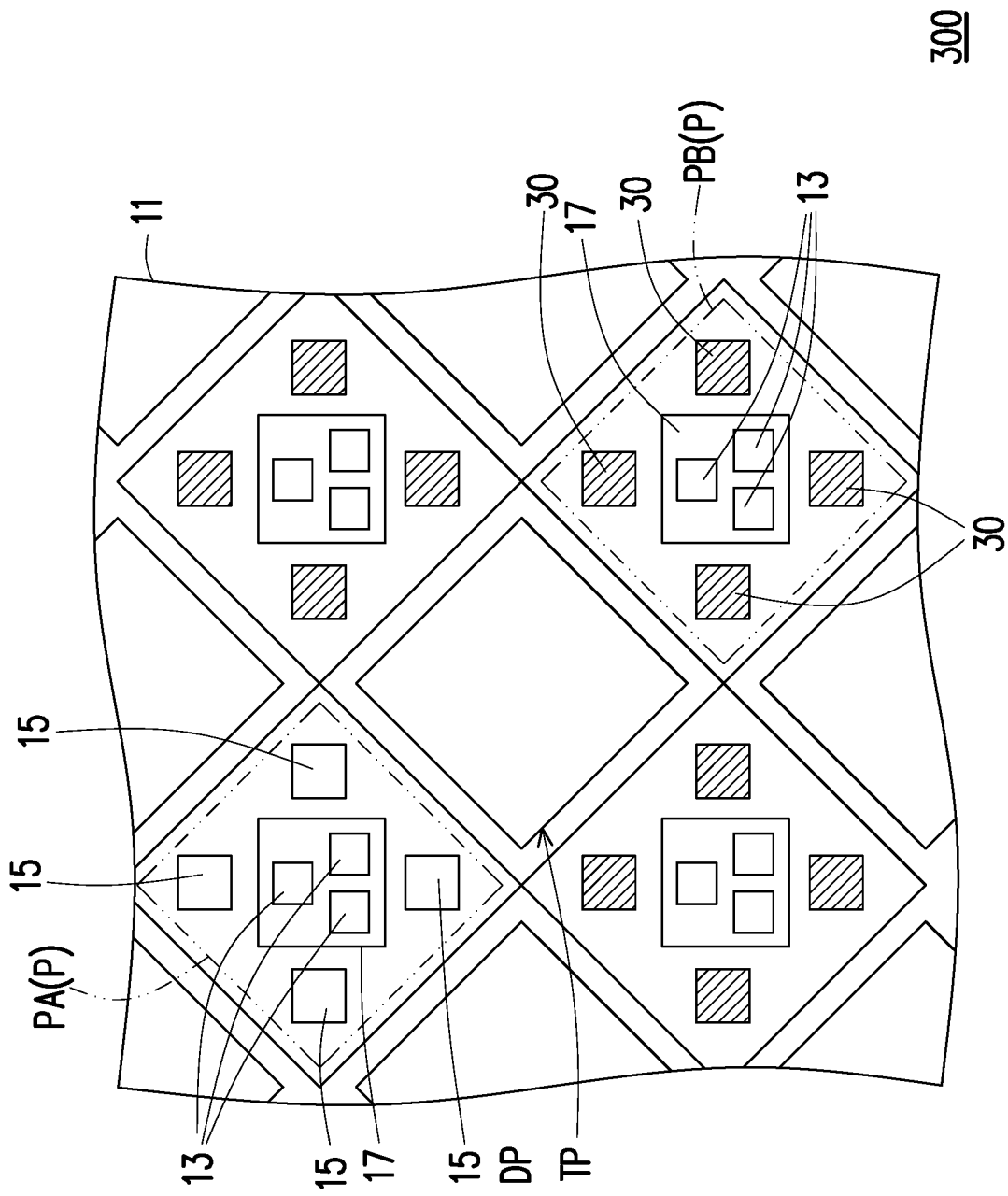
FIG. 12 is a partial top view of the transparent display panel 300 according to another embodiment of this disclosure.

Referring to FIG. 12, FIG. 12 is a partial top view of the transparent display panel 300 according to another embodiment of this disclosure. The transparent display panel 300 includes a light transmissive substrate 11 with a surface (e.g. the surface shown in FIG. 12), and a plurality of top-emitting micro light emitting diodes 13, a plurality of bottom-emitting micro light emitting diodes 15, a light shielding layer 17, and a plurality of pixel-solar cells 30 which are disposed on the surface of the light transmissive substrate 11. The top-emitting micro light emitting diodes 13, the bottom-emitting micro light emitting diodes 15 and the pixel-solar cells 30 are laterally spaced from each other and the light shielding layer 17 overlaps the top-emitting micro light emitting diodes 13. In the embodiments, the transparent display panel 300 has a plurality of pixels P arranged on the surface shown in FIG. 12. Specifically, the top-emitting micro light emitting diodes 13 are arranged in each of the pixels P, the bottom-emitting micro light emitting diodes 15 are arranged in a first group PA of the pixels P and the pixel-solar cells 30 are arranged in a second group PB of the pixels P. In addition, the transparent display panel 300 has a plurality of light transmission areas TP arranged between the pixels P. The light transmission areas TP and the pixels P can be arranged alternatively and can have similar pitch, but the disclosure is not limited thereto. With the arrangement of the light transmission areas TP, the transparent display panel 300 can have required light transmittance. In some embodiments, an overall light transmittance of the transparent display panel 300 can be greater than 40%. For illustration purpose, the squares with hatch lines in FIG. 12 and the following drawing represent the pixel-solar cells 30 while the same sized blank squares represent the bottom-emitting micro light emitting diode 15.

The top-emitting micro light emitting diodes 13 are disposed on the surface of the light transmissive substrate 11 and arranged in the pixels P. For example, each of the pixels P is disposed with three top-emitting micro light emitting diodes 13. The three top-emitting micro light emitting diodes 13 in the same pixel P can be disposed over a common portion of the light shielding layer 17, so that the rays emitted from the top-emitting micro light emitting diodes 13 toward the light transmissive substrate 11 is shielded. Accordingly, the top-emitting micro light emitting diodes 13 are used for emitting rays in a first direction so as to form an image in the first direction. The three top-emitting micro light emitting diodes 13 in the same pixel P can respectively emit rays of RGB (red-green-blue) colors, but the disclosure is not limited thereto. In alternative embodiments, one single pixel P can include four top-emitting micro light emitting diodes 13.

The bottom-emitting micro light emitting diodes 15 are disposed on the surface of the light transmissive substrate 11 and arranged in the first group PA of the pixels P while absent in the rest (the second group PB) of the pixels P. For example, FIG. 12 presents four pixels P and the bottom-emitting micro light emitting diodes 15 are arranged in the left-upper one of the four pixels P while the bottom-emitting micro light emitting diodes 15 are absent in the rest of the four pixels P. In the embodiment, the left-upper one of the four pixels P belongs to the first group PA of the pixels P and the rest of the four pixels P belongs to the second group PB of the pixels P. In addition, four bottom-emitting micro light emitting diodes 15 are arranged in the pixel P of the first group PA and respectively emit rays of RGBW (red-green-blue-white) colors or RGBY (red-green-blue-yellow) colors, but the disclosure is not limited thereto. Each of the bottom-emitting micro light emitting diodes 15 has a structure similar to the bottom-emitting micro light emitting diode 15 shown in FIG. 11 so that the rays from the bottom-emitting micro light emitting diodes 15 emit in a second direction that is opposite to the first direction of the ray from the top-emitting micro light emitting diodes 13. Namely, the bottom-emitting micro light emitting diodes 30 are used for emitting rays in the second direction.

The pixel-solar cells 30 are disposed on the surface of the light transmissive substrate 11 and arranged in the second group PB of the pixels P. For example, FIG. 12 presents four pixels P and the pixel-solar cells 30 are arranged in only three of the four pixels P. In the embodiment, the pixel-solar cells 30 are absent in the first group PA of the pixels P disposed with the top-emitting micro light emitting diodes 15 and vice versa. The pixel-solar cells 30 have a structure similar to the pixel-solar cells 30 shown in FIG. 11 and provide the photoelectric conversion ability so that the transparent display panel 300 required less external power.

Figure 13:
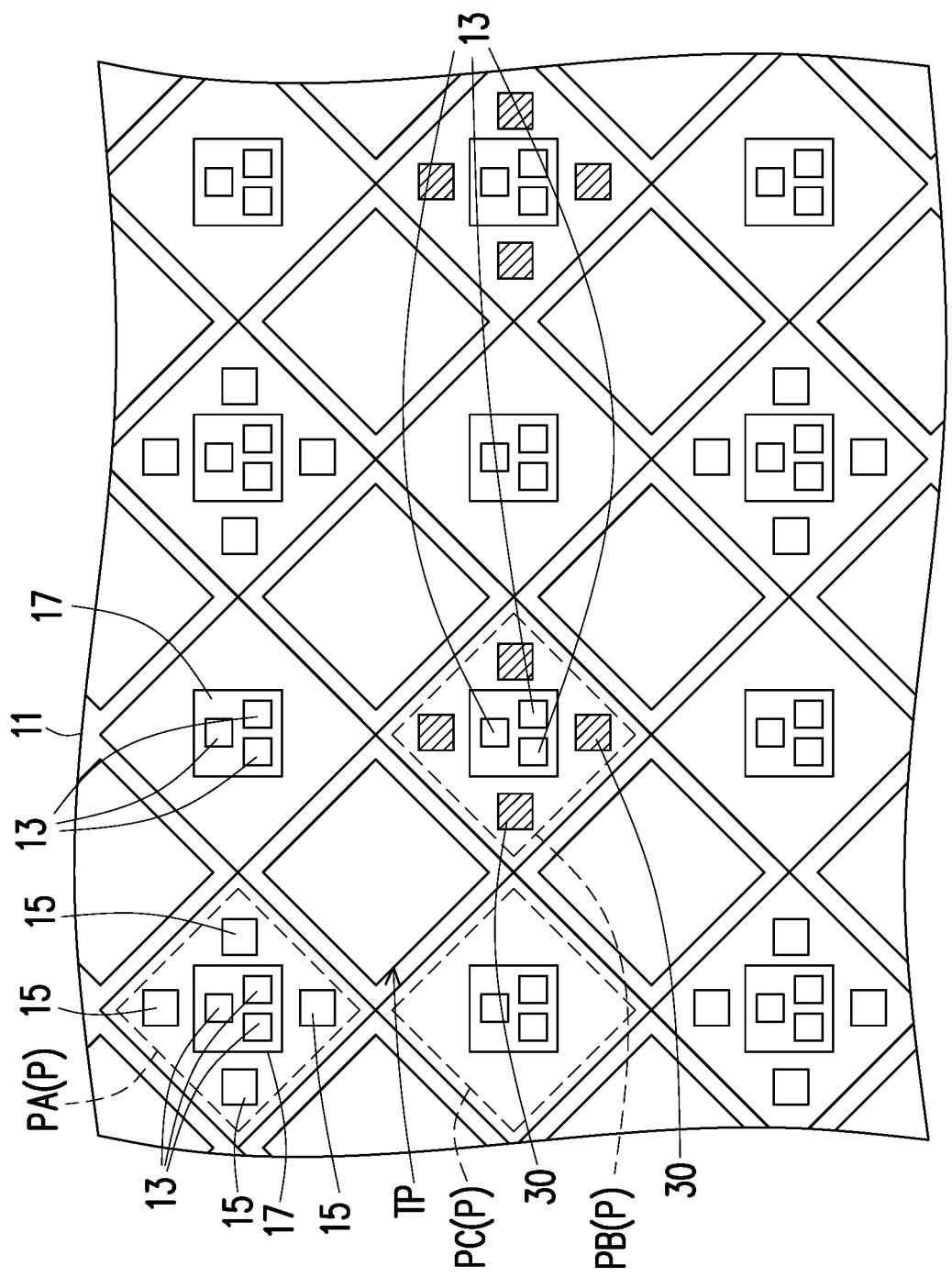
FIG. 13 is a partial top view of the transparent display panel 400 according to another embodiment of this disclosure.

Referring to FIG. 13, FIG. 13 is a partial top view of the transparent display panel 400 according to another embodiment of this disclosure. The transparent display panel 400 is similar to the transparent display panel 300 and the same reference numbers described in the two embodiments represent the same components so that the descriptions for these components in FIG. 12 can be applicable in the transparent display panel 400. The transparent display panel 400 is different from the transparent display panel 300 in that the pixels P further include a third group PC. Specifically, the pixels P in the transparent display panel 400 can divide into a first group PA, a second group PB and a third group PC. The first group PA of the pixels P is disposed with the top-emitting micro light emitting diodes 13 and the bottom-emitting micro light emitting diodes 15, the second group PB of the pixels P is disposed with the top-emitting micro light emitting diodes 13 and the pixel-solar cells 30, and the third group PC of the pixels P is disposed with the top-emitting micro light emitting diodes 13.

Specifically, the transparent display panel 400 includes a light transmissive substrate 11 with a surface (e.g. the surface shown in FIG. 13), a plurality of top-emitting micro light emitting diodes 13, a plurality of bottom-emitting micro light emitting diodes 15, a light shielding layer 17, and a plurality of pixel-solar cells 30. The top-emitting micro light emitting diodes 13, the bottom-emitting micro light emitting diodes 15 and the pixel-solar cells 30 are laterally spaced from each other and the light shielding layer 17 is disposed between the top-emitting micro light emitting diodes 13 and the light transmissive substrate 11. In addition, the transparent display panel 400 has a plurality of light transmission areas TP arranged between the pixels P and an overall light transmittance of the transparent display panel 400 is greater than 40%.

In the embodiment, three top-emitting micro light emitting diodes 13 and four bottom-emitting micro light emitting diodes 15 are arranged in each pixel P of the first group PA, while no pixel-solar cell 30 is arranged in the first group PA of the pixels P. Three top-emitting micro light emitting diodes 13 and four pixel-solar cells 30 are arranged in each pixel P of the second group PB, while no bottom-emitting micro light emitting diode 15 is arranged in the second group PB of the pixels P. In addition, three top-emitting micro light emitting diodes 13 are arranged in each pixel P of the third group PC, while none of the pixel-solar cell 30 and the bottom-emitting micro light emitting diode 15 is arranged in the third group PC of the pixels P. Accordingly, the arrangement density of the top-emitting micro light emitting diodes 13 can be greater than the arrangement density of the bottom-emitting micro light emitting diodes 15 and also greater than the arrangement density of the pixel-solar cells 30. In addition, the quantity of the top-emitting micro light emitting diodes 13 in each pixel P of the first group PA, the quantity of the top-emitting micro light emitting diodes 13 in each pixel P of the second group PB and the quantity of the top-emitting micro light emitting diodes 13 in each pixel P of the third group PC can be the same.

In the embodiment, the top-emitting micro light emitting diodes 13, the bottom-emitting micro light emitting diodes 15 and the pixel-solar cells 30 can have the cross sections similar to those depicted in FIG. 11. In addition, the transparent display panel 300 and the transparent display panel 400 can further include one or more light guide element that is described in FIG. 10 so as to enhance the photoelectric conversion efficiency of the pixel solar cells 30.

In summary, the present disclosure provides a transparent display panel having top-emitting micro light emitting diodes and a bottom-emitting micro light emitting diodes. A portion of a light shielding layer is disposed between the top-emitting micro light emitting diode and a light transmissive substrate. The bottom-emitting micro light emitting diode has a light shielding component and a surface far away from the light transmissive substrate, and the light shielding component disposes on the surface. Thereby, the transparent display panel can provide a light source in different directions by the top-emitting micro light emitting diodes and the bottom-emitting micro light emitting diodes. Since the top-emitting micro light emitting diode and the bottom-emitting micro light emitting diode are disposed on the same panel, the thickness of the transparent display panel can reduce. In addition, a portion of the pixels in the transparent display panel is disposed with one or more pixel solar cell so that the transparent display panel may require less external power.

What is claimed is:

1. A transparent display panel, comprising:
a light transmissive substrate, with a surface;
a plurality of first pixels arranged on the surface to form an image in a first direction;
a plurality of second pixels arranged on the surface to form an image in a second direction, wherein a pitch of the first pixels is different from a pitch of the second pixels;
a plurality of top-emitting micro light emitting diodes for emitting rays in the first direction, the top-emitting micro light emitting diodes being disposed on the surface and arranged in the first pixels;
a plurality of bottom-emitting micro light emitting diodes for emitting rays in the second direction, the bottom-emitting micro light emitting diodes being disposed on the surface and arranged in the second pixels, wherein each of the bottom-emitting micro light emitting diodes comprises an epitaxial structure and a light shielding component, the epitaxial structure has an upper surface and a lower surface, the lower surface faces the light transmissive substrate, and the light shielding component is disposed on the upper surface to shield the rays emitted from the bottom-emitting micro light emitting diodes towards the upper surface; and
a plurality of pixel-solar cells, disposed on the surface and arranged in the second pixels.

2. The transparent display panel of claim 1, wherein the pitch of the first pixels is smaller than the pitch of the second pixels.

3. The transparent display panel of claim 1, further comprising a light guide element disposed on the surface and adjacent to one of the pixel-solar cells.

4. The transparent display panel of claim 1, wherein at least one of the bottom-emitting micro light emitting diodes further comprises a reflective sidewall.

5. The transparent display panel of claim 4, wherein the reflective sidewall is oblique with respect to the surface.

6. The transparent display panel of claim 1, wherein each of the pixel-solar cells is bonded to the light transmissive substrate and has a pillar structure and a height of the pillar structure is greater than a height of the epitaxial structure.

7. The transparent display panel of claim 1, wherein each of the pixel-solar cells is bonded to the light transmissive substrate and has thin-film structure.

8. The transparent display panel of claim 1, wherein a size of each of the bottom-emitting micro light emitting diodes is larger than a size of each of the top-emitting micro light emitting diodes.

9. The transparent display panel of claim 1, wherein an overall light transmittance of the transparent display panel is greater than 40%.

10. A transparent display panel, comprising:
a light transmissive substrate, with a surface;
a plurality of pixels arranged on the surface;
a plurality of top-emitting micro light emitting diodes for emitting rays in a first direction, the top emitting micro light emitting diodes being disposed on the surface and arranged in the pixels;

a plurality of bottom-emitting micro light emitting diodes for emitting rays in a second direction, the bottom-emitting micro light emitting diodes being disposed on the surface and arranged in a first group of the pixels, wherein each of the bottom-emitting micro light emitting diodes comprises an epitaxial structure and a light shielding component, the epitaxial structure has an upper surface and a lower surface, the lower surface faces the light transmissive substrate, and the light shielding component is disposed on the upper surface to shield the rays emitted from the bottom-emitting micro light emitting diodes towards the upper surface; and a plurality of pixel-solar cells, disposed on the surface and arranged in a second group of the pixels without the bottom-emitting micro light emitting diodes, wherein the first group of the pixels are arranged in array with an equal pitch.

11. The transparent display panel of claim 10, wherein the top-emitting micro light emitting diodes are disposed in the first group of the pixels, the second group of the pixels and a third group of the pixel, and the bottom-emitting micro light emitting diodes and the pixel-solar cells are absent in the third group of the pixels.

12. The transparent display panel of claim 10, further comprising a plurality of light transmission areas arranged between the pixels.

13. The transparent display panel of claim 10, further comprising a light guide element disposed on the surface.

14. The transparent display panel of claim 10, wherein at least one of the bottom-emitting micro light emitting diodes further comprises a reflective sidewall being oblique with respect to the surface.

15. The transparent display panel of claim 10, wherein each of the pixel-solar cells is bonded to the light transmissive substrate.

16. The transparent display panel of claim 15, wherein each of the pixel-solar cells has a pillar structure and a height of the pillar structure is greater than a height of the epitaxial structure.

17. The transparent display panel of claim 15, wherein each of the pixel-solar cells has thin-film structure.

18. The transparent display panel of claim 10, wherein a size of each of the bottom-emitting micro light emitting diodes is larger than a size of each of the top-emitting micro light emitting diodes.

19. The transparent display panel of claim 10, wherein an overall light transmittance of the transparent display panel is greater than 40%.

20. The transparent display panel of claim 10, wherein a quantity of the top-emitting micro light emitting diodes in each pixel of the first group and a quantity of the top-emitting micro light emitting diodes in each pixel of the second group are the same.

* * * * *